United States Patent
Kuo et al.

(10) Patent No.: US 6,462,954 B1
(45) Date of Patent: Oct. 8, 2002

(54) MODULAR MACHINE BOARD STRUCTURE CAPABLE OF AUTOMATICALLY CORRECTING THE CONTACT TRAVEL FOR AN ELECTRONIC DEVICE

(75) Inventors: Ping-Huang Kuo, Taipei (TW); Sung-Ming Song, Taipei (TW)

(73) Assignee: Inventec Corporation, Taipei (TW)

( * ) Notice: Subject to any disclaimer, the term of this patent is extended or adjusted under 35 U.S.C. 154(b) by 0 days.

(21) Appl. No.: 09/891,199

(22) Filed: Jun. 26, 2001

(51) Int. Cl.[7] .............................. H05K 7/12; H05K 1/14; H01R 13/15; H01R 4/48
(52) U.S. Cl. ........................ 361/752; 361/736; 361/767; 361/769; 361/758; 439/66; 439/91; 439/331
(58) Field of Search .................................. 361/752, 756, 361/758, 759, 767–769, 787, 796, 801, 736; 439/66, 91, 331

(56) References Cited

U.S. PATENT DOCUMENTS 6,088,228 A  *  7/2000  Petersen et al. ............ 361/720
6,252,768 B1 *  6/2001  Lin ............................. 361/687

* cited by examiner

*Primary Examiner*—David Martin
*Assistant Examiner*—Dameon E. Kevi
(74) *Attorney, Agent, or Firm*—Bacon & Thomas

(57) ABSTRACT

A connector of a modular machine board disposed on an inner edge of a back board of a display apparatus of an electronic device contacts with joint points of the electronic device, such that metal resilient pieces of said connector are assured to tightly contact with said joint points by means of the resilience of resilient component. As a result, even under vibration, the resilient component can regulate the up-and-down position of said connector along with vibration force to enable the metal resilient pieces to maintain a tight contact at the joint points of the electronic device.

10 Claims, 5 Drawing Sheets

MODULAR MACHINE BOARD STRUCTURE CAPABLE OF AUTOMATICALLY CORRECTING THE CONTACT TRAVEL FOR AN ELECTRONIC DEVICE

BACKGROUND OF THE INVENTION

The note book computer design goal of having the strongest function and the thinnest size has resulted in notebook computers that are not only of small volume, but that are also stuffed with various kinds of electronic components in the accommodating space thereof. As a result, only a little accommodating space is left between the display apparatus and the back board of said notebook computer to enable external connection of other electronic equipment, such as a radio receiver and transmitter device, for expanding the functionality of the computer. The inventor of the present invention previously obtained a patent for externally connecting other electronic equipment by utilizing a connector disposed on the back side of the display apparatus, the connector connecting with a main board circuit of a notebook computer via a bus cable, and in which a plurality of metal resilient pieces capable of connecting with the connection points of the externally connected electronic equipment are mounted on the surface of the connector for placing the externally connected electronic equipment into the accommodating space in the back board of said display apparatus, thereby enabling the connection points and the metal resilient pieces of the connector to be connected together so as to unable the externally connected electronic equipment to communicate with the notebook computer for mutually transmitting information.

However, since a notebook computer is carried around and bumped outdoors quiet often, and the up-and-down travel of the metal resilient pieces of the connector is short, when the notebook computer is bumped to cause vibration on said connector, the metal resilient piece of the connector tends to cause inadequate contact with the connection points of the externally connected electronic equipment, thereby disabling the externally connected electronic equipment from being normally on-line with the notebook computer.

In view of this and in order to improve the mentioned shortcomings of the conventional connector, the inventor of the present invention, following long-term endeavor in research and experiment, has developed and designed a modular machine board structure capable of automatically correcting for contact travel in an electronic device.

SUMMARY OF THE INVENTION

One of the objectives of the present invention is to provide a modular machine board structure capable of automatically correcting for contact travel in an electronic device and that has a modular machine board disposed on an inner edge of a back board of a display apparatus of an electronic device, one end of the modular machine board being movably retained by a retainer mounted on the back board, and another end thereof being positioned by a positioning component mounted on the back board. A connector is disposed on one lateral surface of the positioning component of the modular machine board, a plurality of metal resilient pieces are mounted on the top side of the connector, and a resilient component is mounted at a position where said back board inner edge corresponds to the back side of said connector. Thereby, when the connector of the modular machine board contacts with the connection points of the electronic device, the metal resilient pieces of the connector are assured to tightly contact the connection or contact points of the electronic device by means of the resilience of the resilient component. Even under vibration, the resilient component can regulate the position of the connector up-and-down along with the vibration force to enable the metal resilient pieces of the connector to maintain a tight contact at the positions of the connection points of said electronic device.

DETAILED DESCRIPTION OF THE PREFERRED EMBODIMENTS

Figure 1:
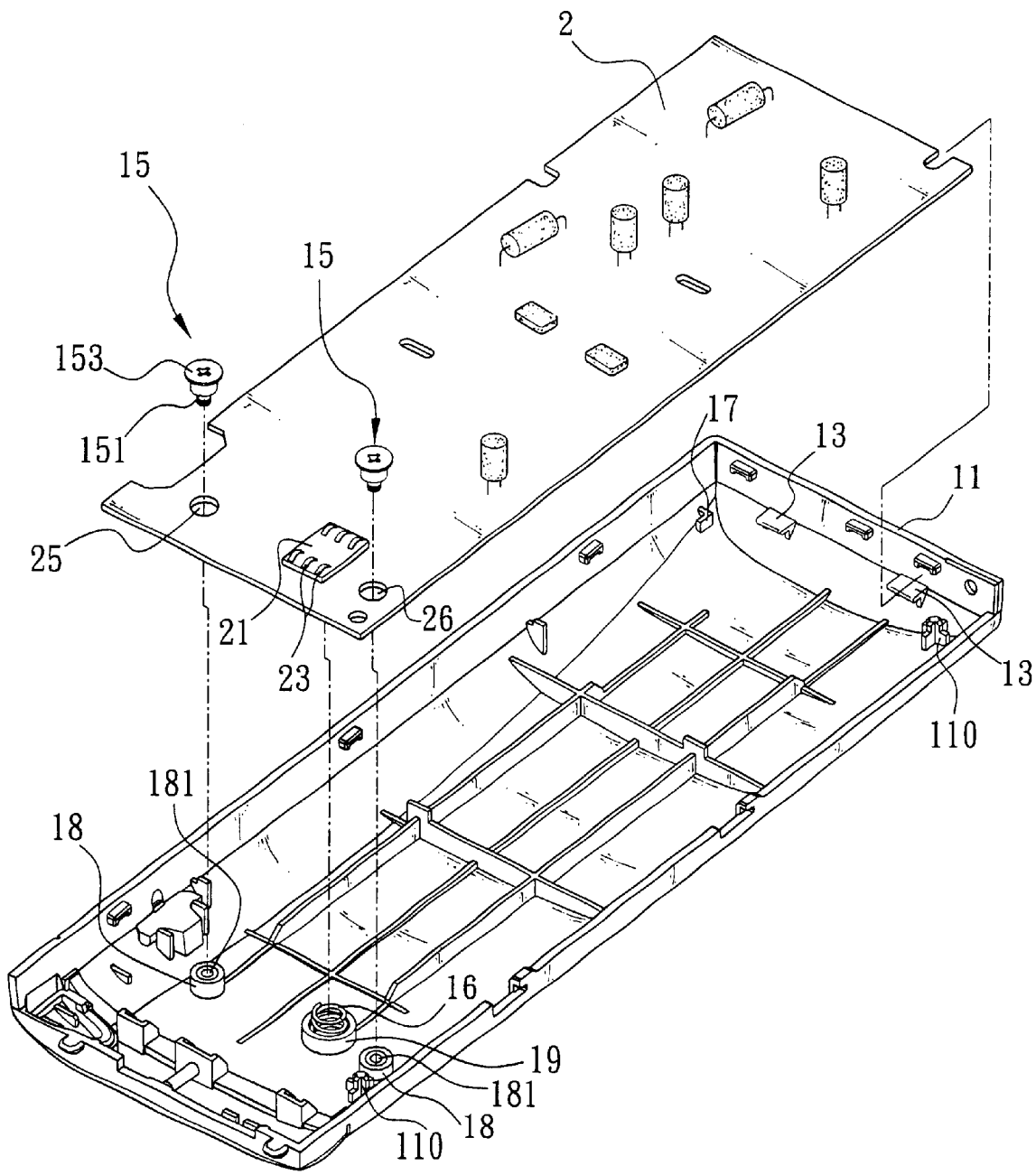
FIG. 1 is a pictorial and exploded drawing of the present invention.
Figure 3:
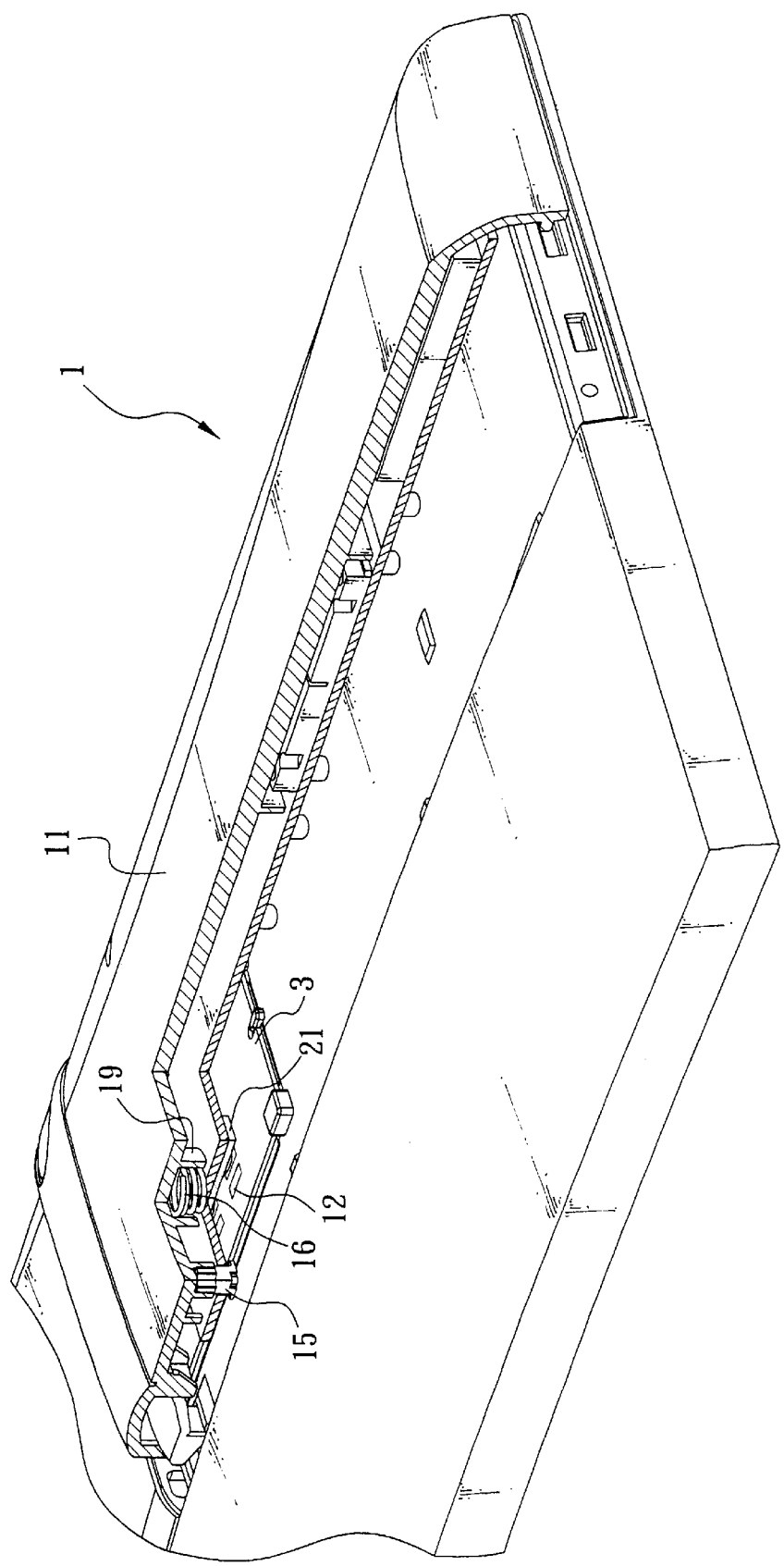
FIG. 3 is a pictorial and exploded drawing of the present invention and an electronic device.
Figure 4:
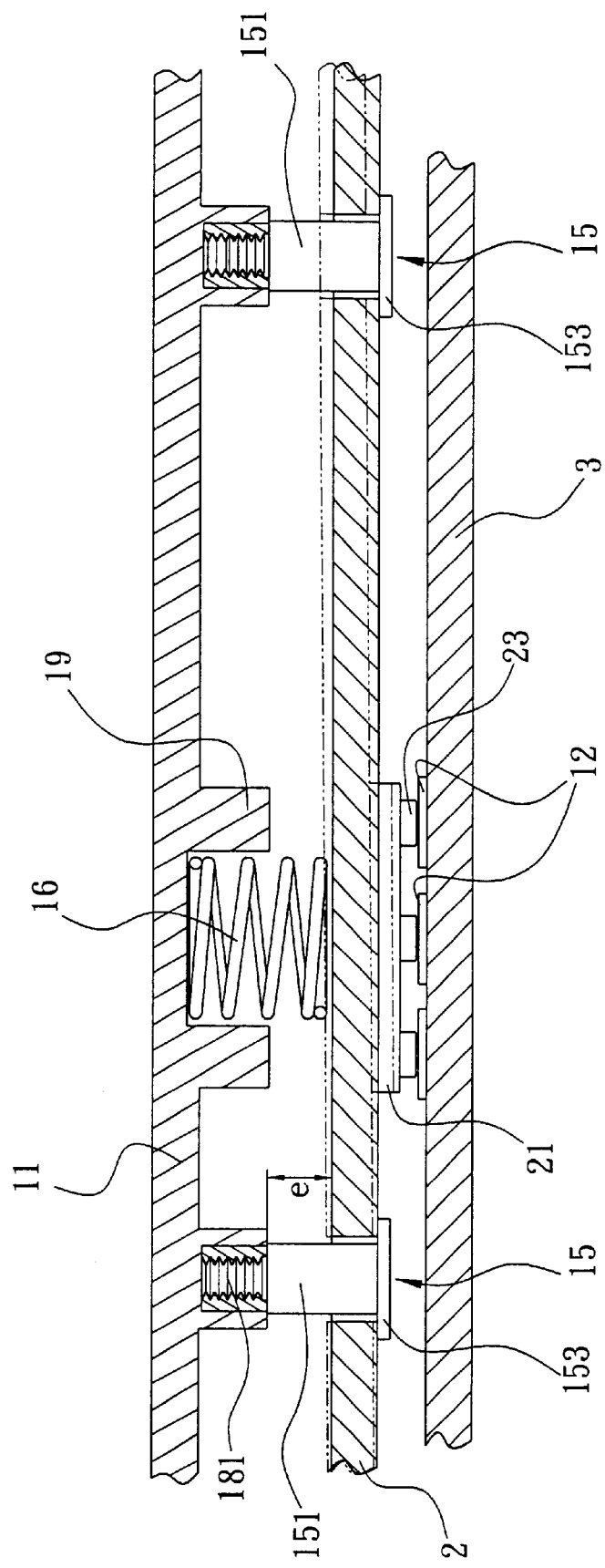
FIG. 4 is a schematic drawing of the movement of the application state of the present invention.
Figure 5:
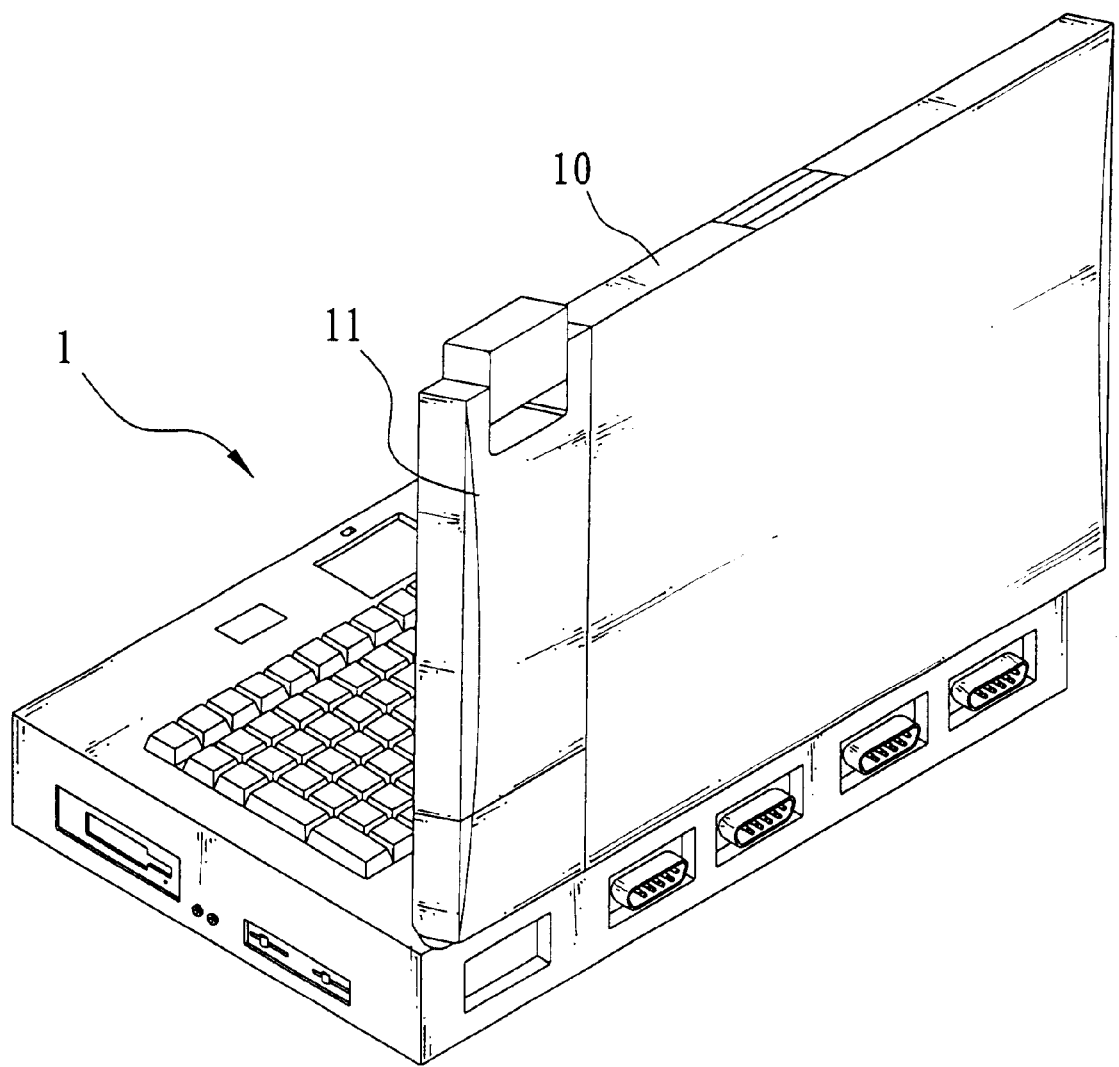
FIG. 5 is a pictorial and external view drawing of the present invention and an electronic device.

The present invention is a modular machine board structure capable of automatically correcting the contact travel for an electronic device, referring to FIGS. 1 and 5. A modular machine board (2), such as a video camera circuit board, is disposed on an inner edge of a back board (11) of a display apparatus (10) of the electronic device (1), which may be a notebook computer. One end of the modular machine board (2) is movably retained onto a retainer (13) mounted on the back board (11). Another end thereof is positioned onto a positioning component (15) mounted on the back board (11), to enable the another end of the modular machine board (2) to be displaced up-and-down with respect to the original position, the retaining end being used as the leverage supporting point. A connector (21) is disposed on the surface adjacent to one lateral side of said positioning component (15) of the modular machine board (2), and a plurality of metal resilient pieces (23) are mounted on the top side of said connector (21). A resilient component (16)(a spring is used in the exemplary embodiment but the actual embodiment of the present invention is not limited thereto) is mounted at the position where the back board (11) inner edge corresponds to the back side of said connector (21). As a result, when the connector (23) of the modular machine board (2) contacts with a connection point (12) of the electronic device (1), the metal resilient piece (23) of the connector (21) can tightly contact with the connection points (12) of the electronic device (1) by means of the resilience of said resilient component (16), as shown in FIGS. 3 and 4. Even under vibration, the resilient component (16) can regulate the position of the connector (21) up-and-down, along with the vibration force, to enable the metal resilient piece (23) of the connector to maintain a tight contact at the position of the connection points (12) of the electronic device (1).

In the present invention, referring to FIG. 5, since the volume of the electronic device (1) is small and various kinds of electronic components are stuffed in the accommodating space thereof, leaving only a little accommodating space between the display apparatus (10) and the back board (11) of said electronic device (1) that capable of externally connecting other electronic equipment for expanding its function; a video camera is pivotally disposed on the upper end of said back side (11) for collecting the user's images.

Figure 2:
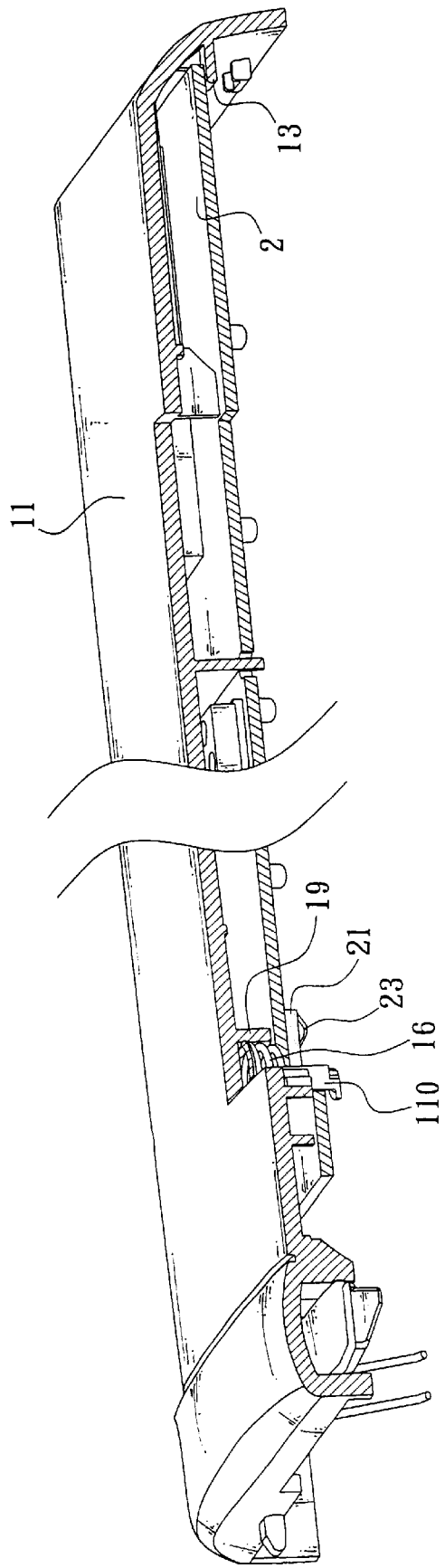
FIG. 2 is a longitudinal pictorial and cross-sectional drawing of the present invention.

In the present invention, referring to FIGS. 1 and 2, the lower side of the at least one retainer (13) disposed on the back board (11), movably retains one end of said modular machine board (2) against a supporting body (17) for supporting the modular machine board (2). The supporting body is mounted at the position where the back board (11) corresponds to the end surface of the modular machine board (2). As a result, the supporting body (17) supports the modular machine board (2) vertically to secure the modular machine board (2) between the retainer (13) and the supporting body (17) and enable the another end of said modular machine board (2) to move up-and-down with the retaining end used as the leverage supporting point.

In the present invention, referring to FIG. 1, at least one positioning component (15) is mounted on the back board (11), another end of the modular machine board (2) being positioned on the positioning component (15). The positioning component (15) can be a screw component (a screw is used in the exemplary embodiment but the actual embodiment of the present invention is not limited thereto). The respective screw component has a rod body (151) and a head section (153), with the outer diameter larger than that of the rod body (151). One end surface of the rod body (151) adjacent to the head section (153) has no outer screw-thread and another end surface is disposed with an outer screw-thread. A screw fastening post (18) is mounted at the position where the back board (11) corresponds to the screw component. The screw fastening post (18) has a cylindrical shape with the inner edge thereof disposed with a negative screw-thread (181) to be fitted with said outer screw-thread. A plurality of through holes (25) are disposed at the position where the modular machine board (2) corresponds to the positioning components (15). The aperture of each through hole (25) is slightly larger than that of the rod body (151) of the screw component so that when the rod body (151) goes through the through hole (25) and screws to the screw positioning post (18), another end of the modular machine board (2) is positioned on the screw component and does not displace left-and-right. In the mean time, the rod body (151) has a certain length that enables the another end and the back board (11) to maintain a proper distance and, as shown in FIG. 4, to move up-and-down on the rod body (151).

In the present invention, referring to FIGS. 1 and 3, the connection points (12) of the electronic device (1) contact an interface circuit of the electronic device (1) via a bus cable to enable the connection points (12) to achieve electric connection with a main board circuit (3) of said electronic device (1). The resilient component (16) is disposed at the position where the inner edge of the back board (11) corresponds to the back side of said connector (21), and a cylindrical body (19) capable of fastening the resilient component is mounted at the position where the back board (11) corresponds to the resilient component (16). One end of said resilient component (16) is placed inside the cylindrical body (19), and another end thereof projects outside said cylindrical body (19). A positioning convex post (110) is respectively disposed on the side angles of the back board (11) where the back board (11) corresponds to the two ends of the modular machine board (2). A through hole (26) is respectively disposed at the position where the modular machine board (2) corresponds to the convex post (110), the through hole (26) being positioned on the positioning convex post (110).

By virtue of the assembly of the mentioned components, referring to FIG. 4, when the metal resilient piece (23) of the connector (21) of said modular machine board (2) contacts and presses against the connection point (12) of the electronic device (1), the metal resilient piece (23) of connector (21) is compressed against the connection point (12), and modular board (2) can electrically connect with the main board circuit (3) of the electronic device (1) for mutually transmitting information. In the mean time, the resilient component (16) is compressed to enable the metal resilient piece (23) of connector (21) to tightly contact with the connection point (12) of the electronic device (1) by means of the resilience of resilient component (16). Even under vibration, the resilient component (16) still can regulate the position of the connector (21) up-and-down along with the vibration force, thereby causing the metal resilient piece (23) of the connector (21) to maintain tight engagement with the connection point (12) of the electronic device (1).

What is claimed is:

1. A modular machine board structure capable of automatically correcting the contact travel for an electronic device comprising:

a modular machine board disposed on a back board inner edge of an electronic device, a first end of said modular machine board being pivotally retained by a retainer mounted on said back board, a second end of the modular machine board being displaced up-and-down by a positioning component mounted on said back board, said first end forming a fulcrum for said up-and-down movement of said machine board by said positioning component, a connector that includes a metal resilient piece electronically connecting said modular machine board with a connection point of a corresponding electrical connector of said electronic device, said connector being disposed on a surface of said modular machine board at said second end adjacent to said positioning component;

a resilient component disposed at a position on the inner edge of said back board corresponding to a position of a back side of said connector;

wherein the metal resilient piece of the connector of said modular machine board presses against and contacts with the connection point of said electronic device, causing the metal resilient piece of said connector to tightly contact with the connection point of said electronic device by means of the resilience of said resilient component even under vibration.

2. A modular machine board structure capable of automatically correcting the contact travel for an electronic device according to claim 1, wherein at least one retainer is disposed on said back board, one end of said modular machine board is movably retained to the lower aspect of said retainer, a supporting body for supporting said modular machine board is mounted at the position where said back board corresponds to said end surface of said modular machine board, thereby, said supporting body supports said modular machine board upwards to enable said modular machine board to set between the retainer and the supporting body so as to enable the another end of said modular machine board to move up-and-down by means of said retaining end used as the leverage supporting point.

3. A modular machine board structure capable of automatically correcting the contact travel for an electronic device according to claim 2, wherein at least one positioning component is disposed on said back board, another end of said modular machine board is positioned on said positioning component.

4. A modular machine board structure capable of automatically correcting the contact travel for an electronic device according to claim 3, wherein said positioning component can be a screw component, said respective screw component has a rod body and a head section with the outer diameter larger than that of said rod body, one end surface of the rod body adjacent to said head section has no outer screw-thread, another end surface is disposed with an outer screw-thread, a screw fastening post is mounted at the position where said back board corresponds to said screw component, said screw fastening post is in a cylindrical shape with the inner edge thereof disposed with a negative screw-thread to be fitted with said outer screw-thread, a plurality of through holes are disposed at the position where said modular machine board corresponds to said positioning components, the aperture of said through hole is slightly larger than that of the rod body of the screw component, thereby when the rod body goes through said through hole and screws to said screw positioning post, said another end of said modular machine board is positioned on said screw component and does not displace left-and-right, at the mean time, since said rod body has a certain length, that enables said another end and said back board to maintain a proper distance and to move up-and-down on said rod body.

5. A modular machine board structure capable of automatically correcting the contact travel for an electronic device according to claim 4, wherein said screw component can be a screw.

6. A modular machine board structure capable of automatically correcting the contact travel for an electronic device according to claim 1, wherein the connection point of said electronic device connects with a main circuit board of said electronic device.

7. A modular machine board structure capable of automatically correcting the contact travel for an electronic device according to claim 1, wherein a cylindrical body capable of fastening said resilient component is mounted at the position where said back board corresponds to said resilient component, one end of said resilient component is placed inside said cylindrical body, another end thereof projects outside said cylindrical body.

8. A modular machine board structure capable of automatically correcting the contact travel for an electronic device according to claim 1, wherein a positioning convex post is respectively disposed on the side angles of said back board where said back board corresponds to the two ends of said modular machine board, a through hole is respectively disposed at the position where said modular machine board corresponds to said convex post, said through hole is positioned on said positioning convex post.

9. A modular machine board structure capable of automatically correcting the contact travel for an electronic device according to claim 7, wherein the resilient component can be a spring.

10. A modular machine board structure capable of automatically correcting the contact travel for an electronic device according to claim 1, wherein the electronic device can be a notebook computer.

* * * * *